(12) United States Patent
Chen et al.

(10) Patent No.: US 10,879,061 B2
(45) Date of Patent: Dec. 29, 2020

(54) SEMICONDUCTOR DEVICE AND METHOD FOR FORMING THE SAME

(71) Applicant: TAIWAN SEMICONDUCTOR MANUFACTURING COMPANY LIMITED, Hsin-Chu (TW)

(72) Inventors: Chun-Heng Chen, Hsinchu (TW); Hong-Fa Luan, Baoshan (TW); Xiong-Fei Yu, Hsinchu (TW); Hui-Cheng Chang, Tainan (TW); Chia-Wei Hsu, Taipei (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 79 days.

(21) Appl. No.: 16/246,805

(22) Filed: Jan. 14, 2019

(65) Prior Publication Data
US 2019/0148141 A1  May 16, 2019

Related U.S. Application Data

(63) Continuation of application No. 14/871,871, filed on Sep. 30, 2015, now Pat. No. 10,181,397.

(51) Int. Cl.
| | | |
|---|---|---|
| *H01L 21/02* | (2006.01) | |
| *H01L 29/51* | (2006.01) | |
| *H01L 23/00* | (2006.01) | |
| *H01L 29/66* | (2006.01) | |
| *H01L 29/78* | (2006.01) | |

(52) U.S. Cl.
CPC .... *H01L 21/02255* (2013.01); *H01L 21/0226* (2013.01); *H01L 21/02233* (2013.01); *H01L 21/02247* (2013.01); *H01L 21/02323* (2013.01); *H01L 21/02337* (2013.01); *H01L 23/564* (2013.01); *H01L 29/513* (2013.01); *H01L 29/518* (2013.01); *H01L 29/66795* (2013.01); *H01L 29/785* (2013.01)

(58) Field of Classification Search
CPC ... H01L 21/0223–02238; H01L 29/511; H01L 29/513; H01L 29/518
See application file for complete search history.

(56) References Cited

U.S. PATENT DOCUMENTS

| | | |
|---|---|---|
| 6,913,961 B2 | 7/2005 | Hwang |
| 8,445,969 B2 | 5/2013 | Chen et al. |
| (Continued) | | |

FOREIGN PATENT DOCUMENTS

JP   2004289082 A   10/2004

OTHER PUBLICATIONS

Razouk, et al., "Kinetics of High Pressure Oxidation of Silicon in Pyrogenic Steam", 1981, J. Electrochem. Soc. vol. 128, No. 10, pp. 2214-2220. Abstract Only.

(Continued)

*Primary Examiner* — Bryan R Junge
(74) *Attorney, Agent, or Firm* — Cooper Legal Group, LLC

(57) ABSTRACT

Semiconductor devices and a method for forming the same are provided. In various embodiments, a method for forming a semiconductor device includes receiving a semiconductor substrate including a channel. An atmosphere-modulation layer is formed over the channel. An annealing process is performed to form an interfacial layer between the channel and the atmosphere-modulation layer.

20 Claims, 16 Drawing Sheets

(56) References Cited

U.S. PATENT DOCUMENTS

| | | |
|---|---|---|
| 2003/0235965 A1 | 12/2003 | Takehiro |
| 2004/0171280 A1 | 9/2004 | Conley, Jr. et al. |
| 2005/0026459 A1* | 2/2005 | O'Meara ............. H01L 21/0214 |
| | | 438/786 |
| 2005/0035345 A1 | 2/2005 | Lin et al. |
| 2005/0205948 A1 | 9/2005 | Rotondaro et al. |
| 2005/0247985 A1 | 11/2005 | Watanabe et al. |
| 2005/0263795 A1 | 12/2005 | Choi et al. |
| 2005/0272192 A1 | 12/2005 | Oh et al. |
| 2008/0128822 A1 | 6/2008 | Koyama et al. |
| 2012/0074386 A1 | 3/2012 | Rachmady et al. |
| 2012/0094504 A1 | 4/2012 | Yao et al. |
| 2012/0241874 A1 | 9/2012 | Kim et al. |
| 2015/0028458 A1 | 1/2015 | Lee et al. |
| 2015/0171857 A1 | 6/2015 | Spessot et al. |
| 2015/0340228 A1 | 11/2015 | Tapily et al. |
| 2016/0315080 A1 | 10/2016 | Song et al. |

OTHER PUBLICATIONS

M. Dai, et al., "Effect of plasma N2 and thermal NH3 nitridation in HfO2 for ultrathin equivalent oxide thickness", J. Appl. Pys., vol. 113, Issue 4 (2013). Abstract only.

M. Sato, et al., "Impact of activation annealing temperature on the performance, negative bias temperature instability, and time-to-dielectric breakdown lifetime of high-k/Metal gate stack p-type metal-oxide-semiconductor field effect transistors", Japanese Journal of Applied Physics, vol. 48, No. 4S, 04C002-1-5, (2009). Abstract only.

C.H. Lee, et al., "Reconsideration of electron mobility in Ge n-MOSFETs from Ge substrate side-atomically flat surface formation, layer-by-layer oxidation, and dissolved oxygen extraction", IEMD 13-32-35, 2013 IEEE.

C.H. Lee, et al., "Ge MOSFETs performance: impact of Ge interface passivation", IEMD 10-416-419, 2010 IEEE.

\* cited by examiner

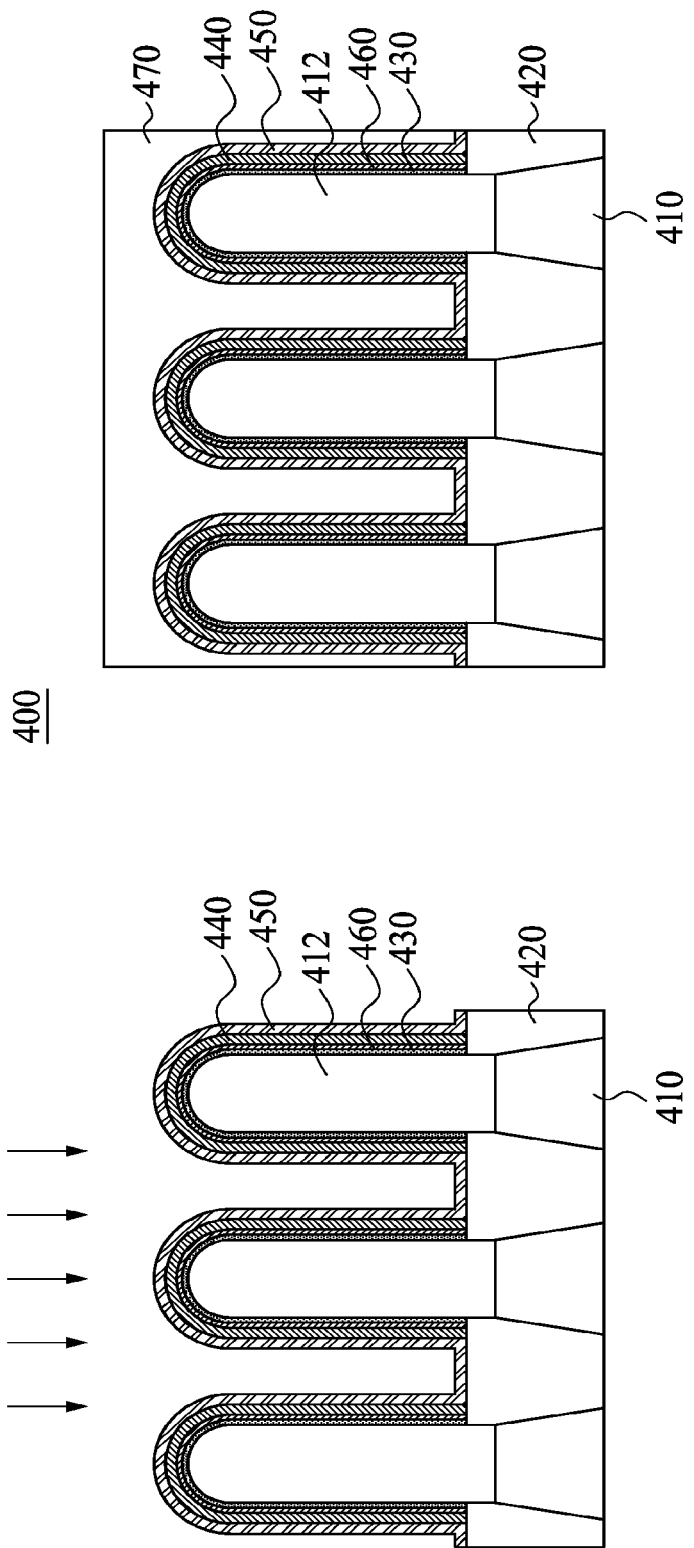

SEMICONDUCTOR DEVICE AND METHOD FOR FORMING THE SAME

RELATED APPLICATIONS

This application is a continuation of and claims priority to U.S. patent application Ser. No. 14/871,871, titled "SEMICONDUCTOR DEVICE AND METHOD FOR FORMING THE SAME" and filed on Sep. 30, 2015, which is incorporated herein by reference.

BACKGROUND

Various thermal treatments are performed on a semiconductor wafer to achieve effective reaction with the interface and the semiconductor wafer while forming a semiconductor device. As the dimensions of the semiconductor device scaled down, the complexity of processing and manufacturing the semiconductor device has been increased due to limited thermal budget requirement, which is related to the processing time and the temperature of the thermal treatments. From the viewpoint of reliability of the semiconductor device, the thermal treatment with high-temperature is favorable. However, such thermal treatment has to be performed within a short time due to limited thermal budget, which may lead to poor semiconductor device performance. Accordingly, the method for forming the semiconductor device has to be continuously improved so as to obtain a more satisfactory semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A through 4D are cross-sectional views at various stages of forming a semiconductor device in accordance with some embodiments.

DETAILED DESCRIPTION

Figure 1B:
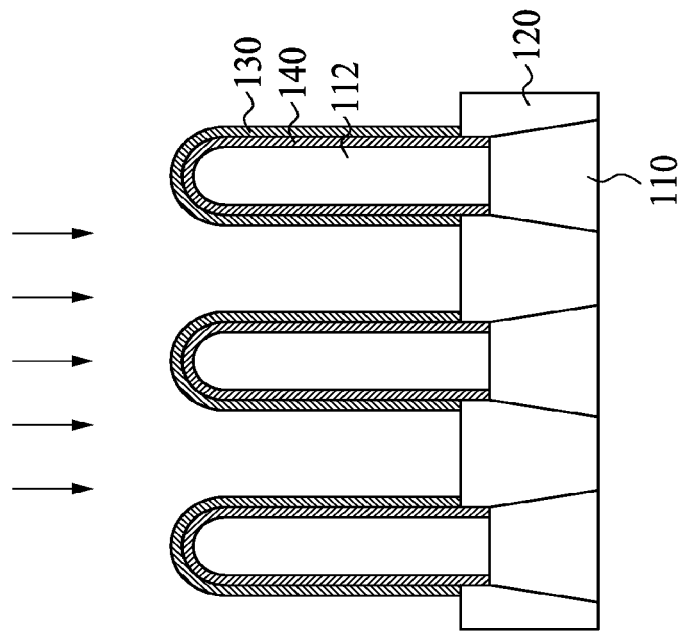
FIGS. 1A through 1C are cross-sectional views at various stages of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, it becomes more challenging for forming a semiconductor device as the dimensions are further scaled down. For instance, optimization of post high-k (HK) annealing is essential to gate stack performance, such as gate leakage, equivalent oxide thickness (EOT) or capacitance equivalent thickness (CET), mobility, and driving current. Moreover, reliability is also strongly affected by post-HK annealing. Generally, an annealing process usually requires high temperature considering the reliability. However, the annealing duration has to be controlled in a short period to prevent thick CET. This would result in poor uniformity and/or strain relaxation of the semiconductor device. Therefore, the method for forming a semiconductor device is continually required to be improved.

In order to solve the above-mentioned problems, the present disclosure provides semiconductor devices and a method for forming the same, which apply an atmosphere-modulation layer that is beneficial for high-pressure annealing with low-thermal budget. Therefore, the uniformity of interfaces in the semiconductor devices can be improved, and the strain from the process-induced stressor can be reserved.

Figure 1A:
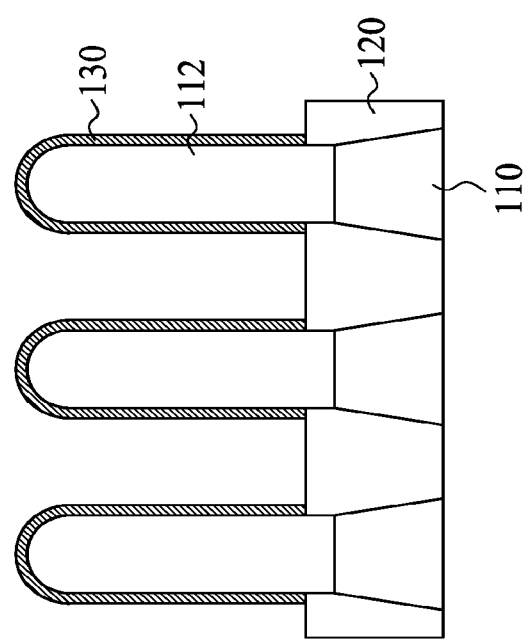
Figure 1C:
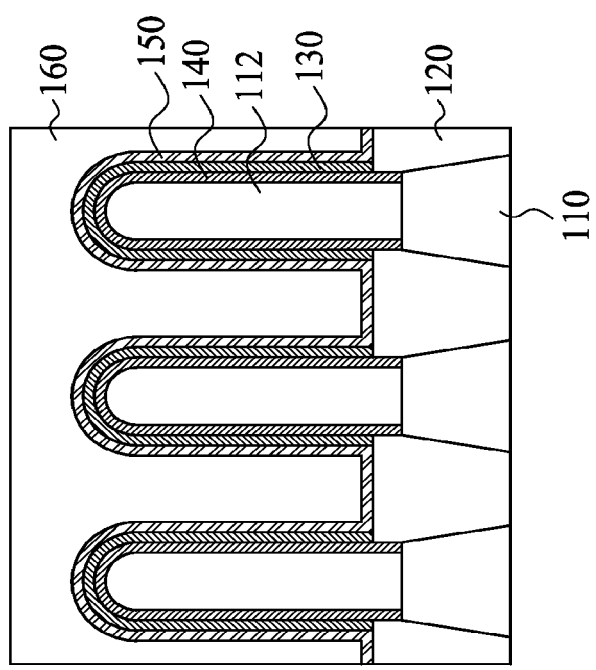

FIGS. 1A through 1C are cross-sectional views at various stages of forming a semiconductor device 100 in accordance with some embodiments.

Referring to FIG. 1A, a semiconductor substrate 110 is received, and the semiconductor substrate 110 includes channels 112. An atmosphere-modulation layer 130 is formed over the channels 112.

In some embodiments, the semiconductor substrate 110 is a bulk substrate or a semiconductor-on-insulator (SOI) substrate. Examples of the material of the semiconductor substrate 110 include but are not limited to pure silicon, pure germanium, a Group IV compound, a Group III-V compound, and a combination thereof. The Group IV compound may be silicon carbide (SiC), silicon germanium (SiGe), or a combination thereof. The Group III-V compound may be GaN, GaP, GaAs, GaSb, AN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The channels 112 are disposed between a source electrode (not shown) and a drain electrode (not shown) for current flowing from the drain electrode to the source electrode or from the source electrode to the drain electrode. In some embodiments, the channels 112 protrude from the semiconductor substrate 110 as shown in FIG. 1A. That is, the channels 112 may be referred as fin structures, and the formed semiconductor device 100 may be a fin-like field-effect transistor (FinFET). The channels (or the fin structures) 112 may be formed by any suitable processes, such as photolithography and etching. The photolithography may include forming a photoresist layer (not shown) over the semiconductor substrate 110, exposing the photoresist layer to form a pattern, performing post-exposure bake processes, and developing the pattern to form a photoresist mask. The aforementioned photoresist mask is used to protect portions of the semiconductor substrate 110 while forming trenches in the semiconductor substrate 110 by the etching process, to form the channels 112.

The semiconductor substrate 110 and the channels 112 may be made of the same or different materials. In some embodiments, the semiconductor substrate 110 and the channels 112 are integrally formed, which there is no boundary between the semiconductor substrate 110 and the channels 112.

As shown in FIG. 1A, isolation structures 120 may be formed in the semiconductor substrate 110, and between two adjacent channels 112. In some embodiments, the isolation structures 120 are shallow trench isolation (STI) structures. The isolation structures 120 are configured to separate the two channels 112. The isolation structures 120 may be made of a dielectric material. Examples of the dielectric material includes but are not limited to silicon oxide, silicon nitride, silicon oxynitride, fluoride-doped silicate glass, a low-k dielectric material, and a combination thereof. The isolation structures 120 may be formed by any suitable technique. For instance, the material of the isolation structures 120 is deposited over the semiconductor substrate 110. Then, an upper portion of the isolation structure material is removed, thereby forming the isolation structures 120 between the channels 112. The isolation structure material may be deposited by chemical vapor deposition (CVD), plasma enhanced chemical vapor deposition (PECVD), low-pressure chemical vapor deposition (LPCVD), high-pressure chemical vapor deposition (HPCVD), or the like. The upper portion of the isolation structure material may be removed by chemical-mechanical polishing (CMP) and/or etching.

In some embodiments, the atmosphere-modulation layer 130 has a thickness in a range from about 5 angstrom (Å) to about 20 Å. The atmosphere-modulation layer 130 may be made of a material selected from the group consisting of metal nitride (e.g., $AlN_x$), oxynitride (e.g., $SiO_xN_y$), and a combination thereof, and may be referred as a nitrogen containing layer. In some embodiments, the atmosphere-modulation layer 130 is formed by various nitridation or deposition processes, such as plasma nitridation or atomic layer deposition (ALD).

Referring to FIG. 1B, an annealing process is performed, thereby forming an interfacial layer 140 between the channel 112 and the atmosphere-modulation layer 130.

In some embodiments, the annealing process is a high-pressure annealing process, and is performed in an oxygen-containing gas. Hence, the atmosphere-modulation layer 130 is used to control the amount of oxygen entering the channels 112 in order to slow down the speed of the oxygen entering the channels 112, and may be referred as an oxygen-modulation layer. The oxygen-containing gas may include at least one of oxygen ($O_2$), ozone ($O_3$), water vapor ($H_2O$ or $D_2O$), nitric oxide (NO), nitrous oxide ($N_2O$), and nitrogen dioxide ($NO_2$). Specifically, high-pressure deuterium or hydrogen annealing shows benefit to the interface state density as well as the reliability, such as hot carrier effect (HCE).

The process pressure for the high-pressure annealing process may lie in between about 10 atmospheres (atm) to about 70 atm. The structure may be heated under a temperature of about 200° C. to about 700° C. In some embodiments, the annealing process is performed for about 3 minutes to about 60 minutes, which is the duration of the structure being heated under high pressure.

It is noteworthy that the annealing temperature of the method in accordance with some embodiments of the present disclosure is lower than that of general methods, which is usually over 900° C. The high-temperature annealing used in general methods would not be workable for the Ge or III-V based materials, because these materials have low melting points. Even for the Si-based semiconductor device, there is potential risk of strain relaxation as annealing temperature is elevated. Accordingly, the method of the present disclosure with lower annealing temperature is suitable for forming the semiconductor device, especially for the semiconductor device with high-mobility channel such as Ge-containing and Group III-V based materials. Moreover, the method of the present disclosure is with low-thermal budget, which effectively reserves the strain from the process-induced stressor.

Further, the method in accordance with some embodiments of the present disclosure has a longer annealing duration than general methods, which is usually few seconds. A semiconductor device treated by general methods with such a short time would result in poor uniformity of interfacial layer. Although the uniformity can be improved by a longer annealing duration, this would cause over-thick CET, which is undesirable for semiconductor device. In contrast, the method of the present disclosure includes the atmosphere-modulation layer. The atmosphere-modulation layer 130 is used to control the amount of atmosphere that is used in the annealing process entering the channels 112. That is, the speed of the atmosphere entering the channels 112 can be slowed down. The atmosphere is blocked in the atmosphere-modulation layer 130, and the portion of the channels 112 adjacent to the atmosphere-modulation layer 130 is annealed to form the interfacial layer 140. Hence, the reaction time of the annealing process can be increased, thereby improving the CET as well as the uniformity of the interfacial layer 140 and post high-k annealing.

The interfacial layer 140 is formed from the channels 112. In some embodiments, when the annealing process is performed in the oxygen-containing gas, the interfacial layer 140 is formed by oxidation of the channels 112. That is, the material of the interfacial layer 140 is oxide of the material of the channels 112. The formed interfacial layer 140 after the high-pressure annealing process may be a few angstrom thick, which may be tuned by annealing condition, properties of the atmosphere-modulation layer 130, and materials of the semiconductor substrate 110. In some embodiments, the interfacial layer 140 has a thickness in a range from about 5 Å to about 50 Å.

Referring to FIG. 1C, a gate dielectric layer 150 and a gate electrode 160 are formed over the atmosphere-modulation layer 130 to form the semiconductor device 100.

In some embodiments, the gate dielectric layer 150 is a high-k dielectric layer. As used herein, the term "high-k dielectric" refers to the material having a dielectric constant, k, greater than about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2.

In some embodiments, the gate electrode 160 is made of a material such as metal, metal alloy, and metal silicide. Examples of the material of the metal gate electrode include but are not limited to tungsten (W), titanium (Ti), tantalum (Ta), aluminum (Al), nickel (Ni), ruthenium (Ru), palladium (Pd), platinum (Pt), tungsten nitride ($WN_x$), titanium nitride (TiN), tantalum nitride (TaN), aluminum nitride (AlN), tungsten silicide ($WSi_x$), nickel silicide ($Ni_2Si$), titanium silicide ($TiSi_2$), titanium aluminide (TiAl), an alloy thereof, and a combination thereof.

In some embodiments, the gate dielectric layer 150 and the gate electrode 160 are formed by deposition, such as chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering, and a combination thereof. In some embodiments, the gate dielectric layer 150 is deposited onto the atmosphere-modulation layer 130 by ALD, and the gate electrode 160 is subsequently deposited.

The formed semiconductor device 100 includes the semiconductor substrate 110 that includes the channels (or the fin structures) 112, the interfacial layer 140, the atmosphere-modulation layer (or the nitrogen-containing layer) 130, the gate dielectric layer 150, and the gate electrode 160. The interfacial layer 140 is over the channels 112. The atmosphere-modulation layer 130 is over the interfacial layer 140. The gate dielectric layer 150 is over the atmosphere-modulation layer 130. The gate electrode 160 is over the gate dielectric layer 150.

The method for forming the semiconductor device 100 in accordance with some embodiments of the present disclosure applies the atmosphere-modulation layer 130 and the high-pressure annealing, which is a highly integrated and low-thermal budget gate stack process to improve uniformity of the interfacial layer and strain relaxation. Further, by using the method shown in FIGS. 1A through 1C, both bulk gate dielectric layer/interfacial layer as well as interfacial layer/semiconductor substrate interface can be passivated in one-step process, which reduces the thermal budget and process cost.

It is noteworthy that the shown in FIGS. 1A through 1C forming method and the formed structure are examples, and can be applied to all kinds of structures and methods for forming the same. Examples of the structure include but are not limited to planar MOSFET, SOI MOSFET, FinFET, and nanowire FET.

Figure 2B:
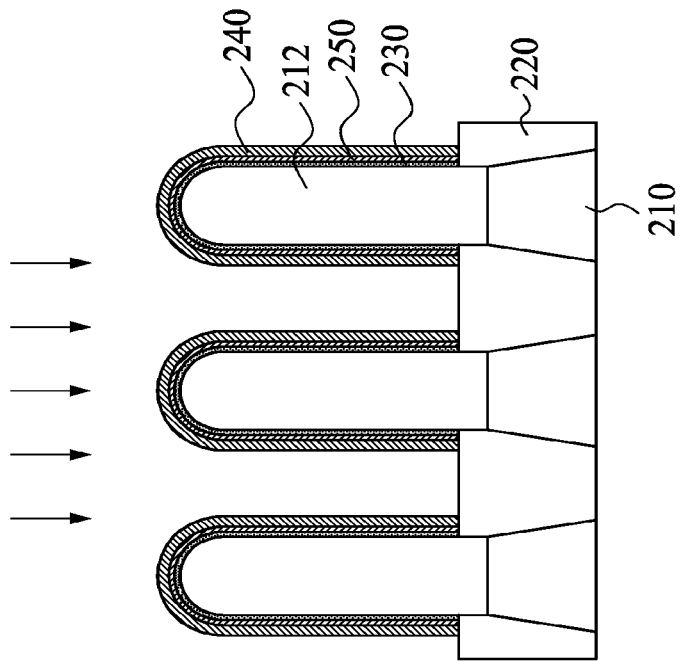
FIGS. 2A through 2C are cross-sectional views at various stages of forming a semiconductor device in accordance with some embodiments.
Figure 2A:
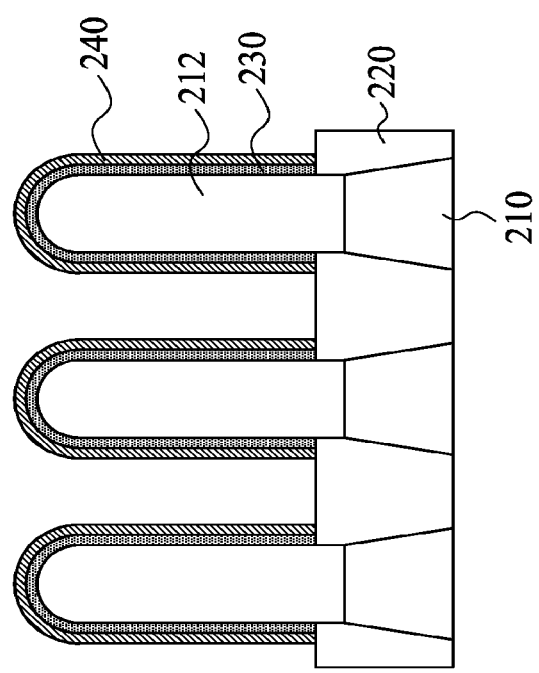
Figure 2C:
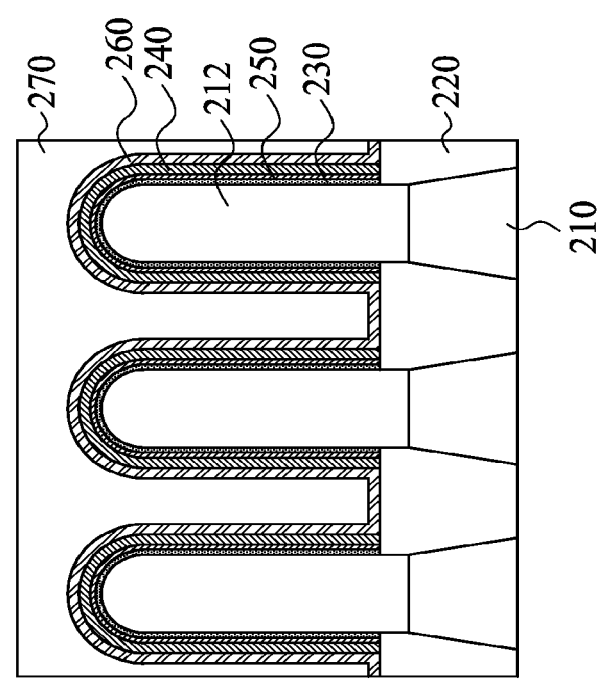

FIGS. 2A through 2C are cross-sectional views at various stages of forming a semiconductor device 200 in accordance with some embodiments.

Referring to FIG. 2A, a semiconductor substrate 210 is received, and the semiconductor substrate 210 includes channels 212. Isolation structures 220 may be formed in the semiconductor substrate 210, and between two adjacent channels 212. An initial layer 230 is formed over the channels 212, and an atmosphere-modulation layer 240 is formed over the initial layer 230.

The semiconductor substrate 210 and the channels 212 may be made of the same or different materials, which may be independently selected from the group consisting of pure silicon, pure germanium, a Group IV compound, a Group III-V compound, and a combination thereof.

The initial layer 230 is used as a starting material to form an interfacial layer in the subsequent annealing process. In some embodiments, the initial layer 230 is made of a material selected from the group consisting of oxide, silicon, and a combination thereof. Particularly, the material of the initial layer 230 may be native oxide, intentionally formed oxide by process (including deposition, chemical reaction, or thermal growth), silicon, or a combination thereof. It is noteworthy that the initial layer 230 is used as a silicon capping layer when the channels 212 are not made of pure silicon. The initial layer 230 may be formed by any suitable process, such as deposition.

The atmosphere-modulation layer 240 has a thickness in a range from about 5 Å to about 20 Å. The atmosphere-modulation layer 240 may be made of a material selected from the group consisting of metal nitride (e.g., $AlN_x$), oxynitride (e.g., $SiO_xN_y$), and a combination thereof.

Other features such as materials and forming manners of the semiconductor substrate 210, the channels 212, the isolation structures 220, and the atmosphere-modulation layer 240 may be referred to those exemplified for the counterparts of FIG. 1A.

Referring to FIG. 2B, an annealing process is performed, thereby forming an interfacial layer 250 from the initial layer 230. The formed interfacial layer 250 is between the initial layer 230 and the atmosphere-modulation layer 240. In some embodiments, when the annealing process is performed in the oxygen-containing gas, the interfacial layer 250 is formed by oxidation of the initial layer 230. That is, the material of the interfacial layer 250 is oxide of the material of the initial layer 230.

The atmosphere-modulation layer 240 is used to control the amount of atmosphere that is used in the annealing process entering the initial layer 230. That is, the speed of the atmosphere entering the initial layer 230 can be slowed down. The atmosphere is blocked in the atmosphere-modulation layer 240, and the portion of the initial layer 230 adjacent to the atmosphere-modulation layer 240 is annealed to form the interfacial layer 250.

In some embodiments, the annealing process is a high-pressure annealing process, and is performed in an oxygen-containing gas. The oxygen-containing gas may include at least one of $O_2$, $O_3$, $H_2O$, $D_2O$, NO, $N_2O$, and $NO_2$. The process pressure for the high-pressure annealing process may lie in between about 10 atm to about 70 atm. The structure may be heated under a temperature of about 200° C. to about 700° C. for about 3 minutes to about 60 minutes. Other conditions of the annealing process may be referred to those exemplified for the counterparts of FIG. 1B.

The interfacial layer 250 is formed from the initial layer 230. In some embodiments, when the annealing process is performed in the oxygen-containing gas, the interfacial layer 250 is formed by oxidation of the initial layer 230. That is, the material of the interfacial layer 250 is oxide of the material of the initial layer 230. In some embodiments, the interfacial layer 250 has a thickness in a range from about 5 Å to about 50 Å and may be tuned by annealing condition, properties of the atmosphere-modulation layer 240, and materials of the semiconductor substrate 210.

Referring to FIG. 2C, a gate dielectric layer 260 and a gate electrode 270 are formed over the atmosphere-modulation layer 240 to form the semiconductor device 200. The features such as materials and forming manners of the gate dielectric layer 260 and a gate electrode 270 may be referred to those exemplified for the counterparts of FIG. 1C.

The difference between the forming methods shown in FIGS. 2A through 2C and FIGS. 1A through 1C is that the forming method shown in FIGS. 2A through 2C applies the initial layer 230 to form the interfacial layer 250, while the forming method shown in FIGS. 1A through 1C uses the channels 112 to form the interfacial layer 140. This difference does not affect the functions of other components and steps in the embodiments. Therefore, the semiconductor device 200 and the forming method thereof have the same functions and advantages as the embodiments shown in FIGS. 1A through 1C.

FIGS. 3A through 3D are cross-sectional views at various stages of forming a semiconductor device 300 in accordance with some embodiments.

Figure 3A:
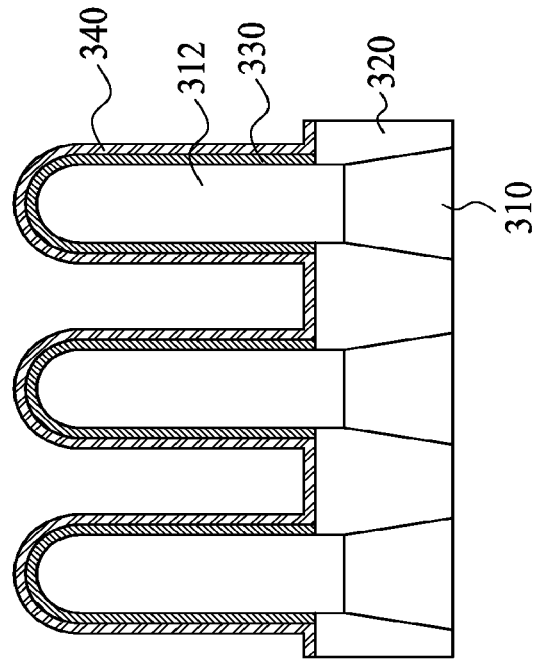
FIGS. 3A through 3D are cross-sectional views at various stages of forming a semiconductor device in accordance with some embodiments.

Referring to FIG. 3A, a semiconductor substrate 310 is received, and the semiconductor substrate 310 includes channels 312. Isolation structures 320 may be formed in the semiconductor substrate 310, and between two adjacent channels 312. An atmosphere-modulation layer 330 is formed over the channels 312.

The semiconductor substrate 310 and the channels 312 may be made of the same or different materials, which may be independently selected from the group consisting of pure silicon, pure germanium, a Group IV compound, a Group III-V compound, and a combination thereof.

The atmosphere-modulation layer 330 has a thickness in a range from about 5 Å to about 20 Å. The atmosphere-modulation layer 330 may be made of a material selected from the group consisting of metal nitride (e.g., $AlN_x$), oxynitride (e.g., $SiO_xN_y$), and a combination thereof. The atmosphere-modulation layer 330 may be formed by any suitable nitridation or deposition processes, (e.g., plasma nitridation or ALD).

Other features such as materials and forming manners of the semiconductor substrate 310, the channels 312, the isolation structures 320, and the atmosphere-modulation layer 330 may be referred to those exemplified for the counterparts of FIG. 1A.

Figure 3B:
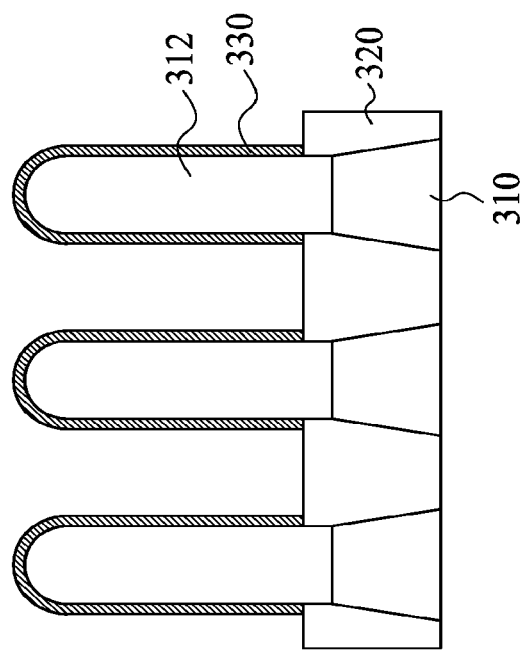

Referring to FIG. 3B, a gate dielectric layer 340 is formed over the atmosphere-modulation layer 330. In some embodiments, the gate dielectric layer 340 is formed by depositing onto the atmosphere-modulation layer 330. The deposition may be performed by, but not limited to, ALD. The material of the gate dielectric layer 340 may be referred to those exemplified for the counterparts of FIG. 1C.

Figure 3D:
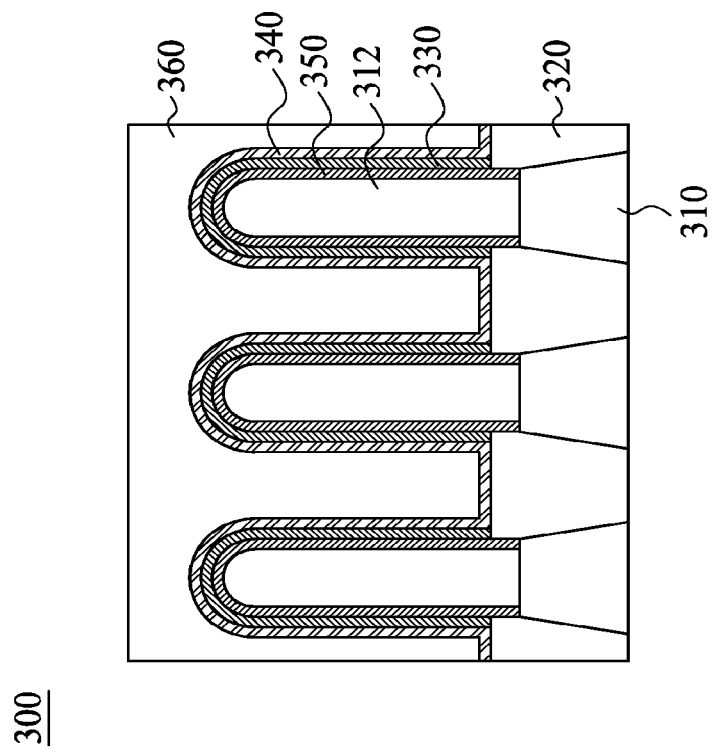
Figure 3C:
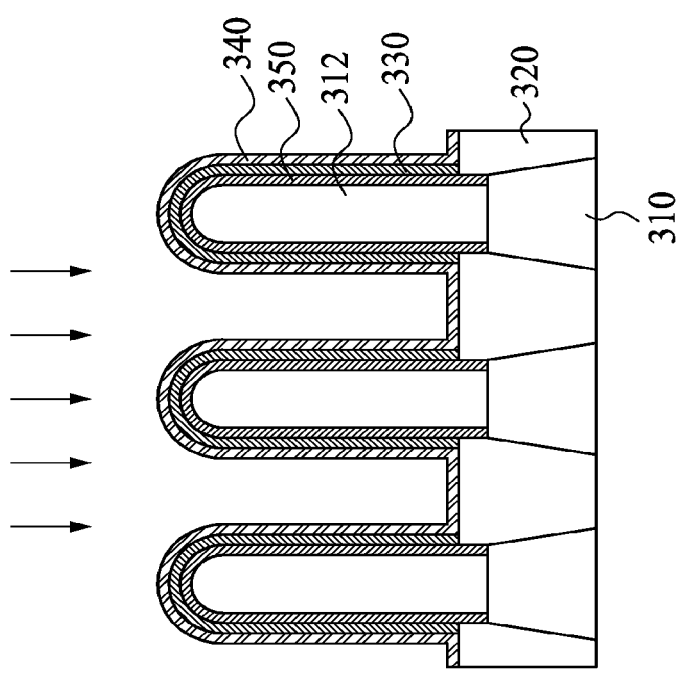

Referring to FIG. 3C, an annealing process is performed, thereby forming an interfacial layer 350 from the channels 312. The formed interfacial layer 350 is between the channels 312 and the atmosphere-modulation layer 330.

The process pressure for the high-pressure annealing process may lie in between about 10 atm to about 70 atm. The structure may be heated under a temperature of about 200° C. to about 700° C. for about 3 minutes to about 60 minutes. Other conditions of the annealing process may be referred to those exemplified for the counterparts of FIG. 1B.

It is noteworthy that the annealing process is performed after depositing the gate dielectric layer 340. In some embodiments, when the gate dielectric layer 340 is made of a high-k dielectric material that containing oxygen, both oxygen-containing and oxygen-free gas may be introduced into ambient of the annealing process. That is, the annealing process may be performed in oxygen-containing gas or oxygen-free gas. The reason that the oxygen-free gas may be used is that the ambient of the annealing process would push the oxygen in the gate dielectric layer 340 penetrating the atmosphere-modulation layer 330 to react with the channels 312, thereby forming the interfacial layer 350. Hence, the oxygen for forming the interfacial layer 350 may be originated from the atmosphere used in the annealing process and/or the material of the gate dielectric layer 340. In some embodiments, the oxygen-containing gas includes at least one of $O_2$, $O_3$, $H_2O$, $D_2O$, NO, $N_2O$, and $NO_2$, and the oxygen-free gas is an inert gas, such as nitrogen ($N_2$), argon (Ar), and a combination thereof.

When the atmosphere that is used in the annealing process contains oxygen, the atmosphere-modulation layer 330 is used to control the amount of the oxygen in the atmosphere entering the channels 312. When the atmosphere that is used in the annealing process is the oxygen-free gas, the atmosphere-modulation layer 330 is used to control the speed of the atmosphere penetrating the atmosphere-modulation layer 330, thereby controlling the amount of the oxygen in the gate dielectric layer 340 entering the channels 312, which the oxygen is pushed by the atmosphere. Accordingly, the speed of the oxygen entering the channels 312 can be slowed down by the atmosphere-modulation layer 330. The oxygen is blocked in the atmosphere-modulation layer 330, and the portion of the channels 312 adjacent to the atmosphere-modulation layer 330 is annealed to form the interfacial layer 350.

In some embodiments, the interfacial layer 350 is formed by oxidation of the channels 312. That is, the material of the interfacial layer 350 is oxide of the material of the channels 312. The formed interfacial layer 350 after the high-pressure annealing may be a few angstrom thick (e.g., about 5 Å to about 50 Å), which may be tuned by annealing condition, properties of the atmosphere-modulation layer 330 and the gate dielectric layer 340, and materials of the semiconductor substrate 310.

Referring to FIG. 3D, a gate electrode 360 is formed over the gate dielectric layer 340 to form the semiconductor device 300. The features such as materials and forming manners of the gate electrode 360 may be referred to those exemplified for the counterparts of FIG. 1C.

The difference between the forming methods shown in FIGS. 3A through 3D and FIGS. 1A through 1C is that the annealing process is performed after the gate dielectric layer 340 deposition in the forming method shown in FIGS. 3A through 3D. This difference does not affect the functions of other components and steps in the embodiments. Therefore, the semiconductor device 300 and the forming method thereof have the same functions and advantages as the embodiments shown in FIGS. 1A through 1C.

FIGS. 4A through 4D are cross-sectional views at various stages of forming a semiconductor device 400 in accordance with some embodiments.

Figure 4A:
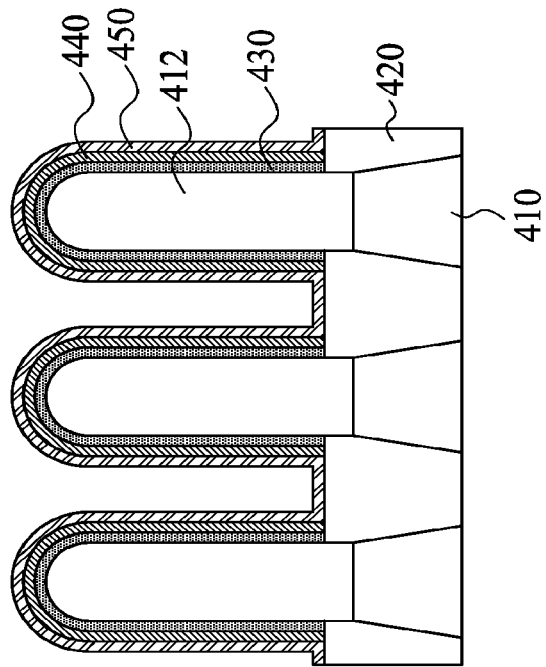

Referring to FIG. 4A, a semiconductor substrate 410 is received, and the semiconductor substrate 410 includes channels 412. Isolation structures 420 may be formed in the semiconductor substrate 410, and between two adjacent channels 412. An initial layer 430 is formed over the channels 412, and an atmosphere-modulation layer 440 is formed over the initial layer 430.

The semiconductor substrate 410 and the channels 412 may be made of the same or different materials, which may be independently selected from the group consisting of pure silicon, pure germanium, a Group IV compound, a Group III-V compound, and a combination thereof.

In some embodiments, the material of the initial layer 430 is native oxide, intentionally formed oxide by process (including deposition, chemical reaction, or thermal growth), silicon, or a combination thereof.

The atmosphere-modulation layer 440 has a thickness in a range from about 5 Å to about 20 Å. The atmosphere-modulation layer 440 may be made of a material selected from the group consisting of metal nitride (e.g., $AlN_x$), oxynitride (e.g., $SiO_xN_y$), and a combination thereof. The atmosphere-modulation layer 440 may be formed by any suitable nitridation or deposition processes (e.g., plasma nitridation or ALD).

Other features such as materials and forming manners of the semiconductor substrate 410, the channels 412, the isolation structures 420, and the atmosphere-modulation layer 440 may be referred to those exemplified for the counterparts of FIG. 1A. Further, other features of the initial layer 430 may be referred to those exemplified for the counterparts of FIG. 2A.

Figure 4B:
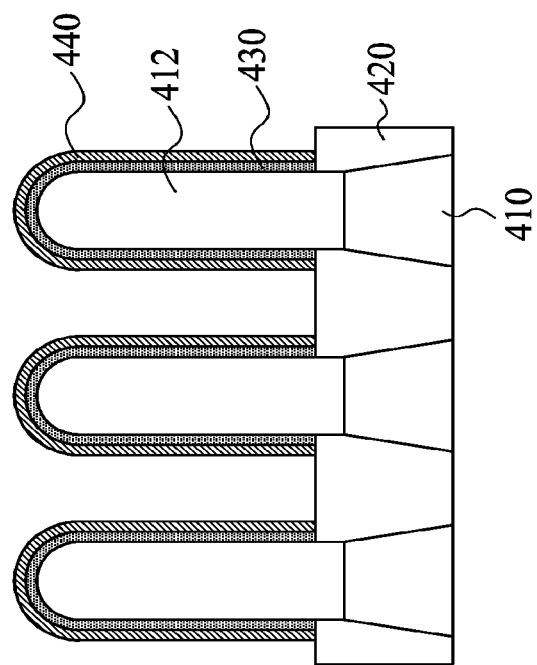

Referring to FIG. 4B, a gate dielectric layer 450 is formed over the atmosphere-modulation layer 440. In some embodiments, the gate dielectric layer 450 is formed by depositing onto the atmosphere-modulation layer 440. The deposition may be performed by, but not limited to, ALD. The material of the gate dielectric layer 450 may be referred to those exemplified for the counterparts of FIG. 1C.

Referring to FIG. 4C, an annealing process is performed, thereby forming an interfacial layer 460 from the initial layer 430. The formed interfacial layer 460 is between the initial layer 430 and the atmosphere-modulation layer 440.

The process pressure for the high-pressure annealing process may lie in between about 10 atm to about 70 atm. The structure may be heated under a temperature of about 200° C. to about 700° C. for about 3 minutes to about 60 minutes. The annealing process is performed after depositing the gate dielectric layer 450. In some embodiments, the gate dielectric layer 450 is made of a high-k dielectric material that containing oxygen, and the annealing process may be performed in oxygen-containing gas or oxygen-free gas. The ambient of the annealing process would push the oxygen in the gate dielectric layer 450 to penetrate the atmosphere-modulation layer 440. A portion of the initial layer 430 would be annealed, thereby forming the interfacial layer 460. Hence, the oxygen for forming the interfacial layer 460 may be originated from the atmosphere used in the annealing process and/or the material of the gate dielectric layer 450. In some embodiments, the oxygen-containing gas includes at least one of $O_2$, $O_3$, $H_2O$, $D_2O$, NO, $N_2O$, and $NO_2$, and the oxygen-free gas is an inert gas, such as nitrogen ($N_2$), argon (Ar), and a combination thereof. Other conditions of the annealing process may be referred to those exemplified for the counterparts of FIG. 1B.

The atmosphere-modulation layer 440 is used to control the amount of atmosphere that is used in the annealing process and/or the oxygen in the gate dielectric layer 450 entering the initial layer 430. That is, the speed of oxygen entering the initial layer 430 can be slowed down. The oxygen is blocked in the atmosphere-modulation layer 440, and the portion of the initial layer 430 adjacent to the atmosphere-modulation layer 440 is annealed to form the interfacial layer 460.

In some embodiments, the interfacial layer 460 is formed by oxidation of the initial layer 430. That is, the material of the interfacial layer 460 is oxide of the material of the initial layer 430. The interfacial layer 460 has a thickness in a range from about 5 Å to about 50 Å and may be tuned by annealing condition, properties of the atmosphere-modulation layer 440, and materials of the semiconductor substrate 410.

Referring to FIG. 4D, a gate electrode 470 is formed over the gate dielectric layer 450 to form the semiconductor device 400. The features such as materials and forming manners of the gate electrode 470 may be referred to those exemplified for the counterparts of FIG. 1C.

The difference between the forming methods shown in FIGS. 4A through 4D and FIGS. 3A through 3D is that the forming method shown in FIGS. 4A through 4D applies the initial layer 430 to form the interfacial layer 460, while the forming method shown in FIGS. 3A through 3D uses the channels 312 to form the interfacial layer 350. This difference does not affect the functions of other components and steps in the embodiments. Therefore, the semiconductor device 400 and the forming method thereof have the same functions and advantages as the embodiments shown in FIGS. 3A through 3D.

FIGS. 5A through 5D are cross-sectional views at various stages of forming a semiconductor device 500 in accordance with some embodiments.

Figure 5B:
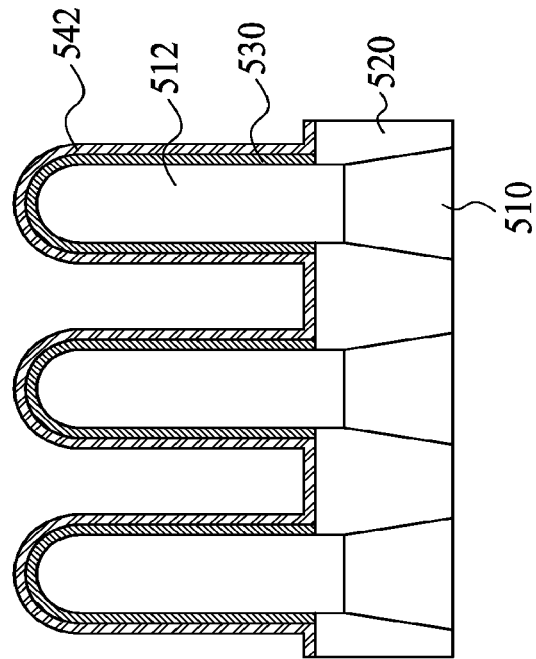
FIGS. 5A through 5D are cross-sectional views at various stages of forming a semiconductor device in accordance with some embodiments.
Figure 5A:
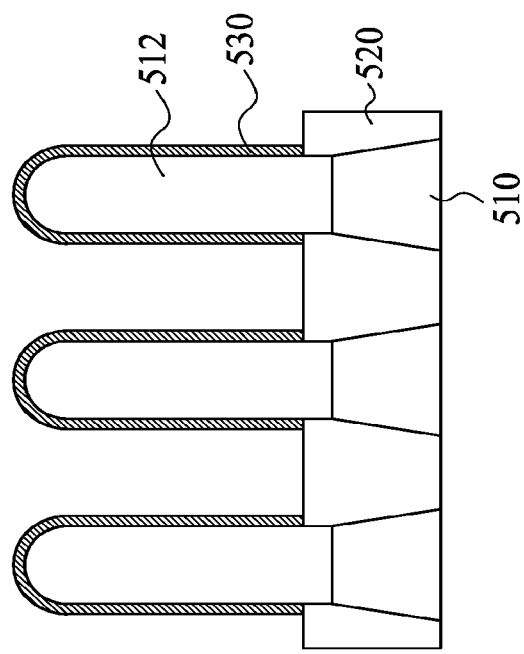

Referring to FIG. 5A, a semiconductor substrate 510 is received, and the semiconductor substrate 510 includes channels 512. Isolation structures 520 may be formed in the semiconductor substrate 510, and between two adjacent channels 512. An atmosphere-modulation layer 530 is formed over the channels 512.

The semiconductor substrate 510 and the channels 512 may be made of the same or different materials, which may be independently selected from the group consisting of pure silicon, pure germanium, a Group IV compound, a Group III-V compound, and a combination thereof.

The atmosphere-modulation layer 530 has a thickness in a range from about 5 Å to about 20 Å. The atmosphere-modulation layer 530 may be made of a material selected from the group consisting of metal nitride (e.g., $AlN_x$), oxynitride (e.g., $SiO_xN_y$), and a combination thereof. The atmosphere-modulation layer 530 may be formed by any suitable nitridation or deposition processes (e.g., plasma nitridation or ALD).

Other features such as materials and forming manners of the semiconductor substrate 510, the channels 512, the isolation structures 520, and the atmosphere-modulation layer 530 may be referred to those exemplified for the counterparts of FIG. 1A.

Referring to FIG. 5B, a first gate dielectric layer 542 is formed over the atmosphere-modulation layer 530. In some embodiments, the first gate dielectric layer 542 is formed by depositing onto the atmosphere-modulation layer 530. The deposition may be performed by, but not limited to, ALD. The material of the first gate dielectric layer 542 may be referred to those exemplified for the counterparts of FIG. 1C.

Figure 5D:
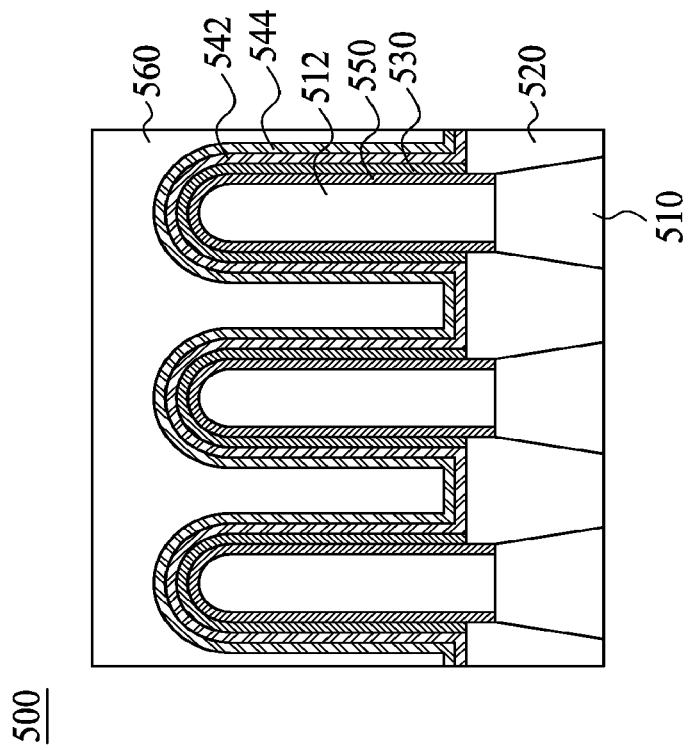
Figure 5C:
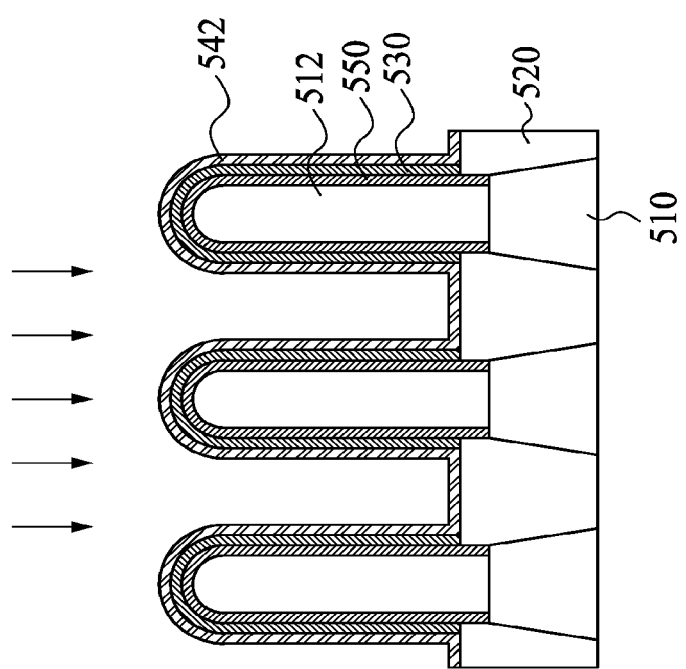

Referring to FIG. 5C, an annealing process is performed, thereby forming an interfacial layer 550 from the channels 512. The formed interfacial layer 550 is between the channels 512 and the atmosphere-modulation layer 530.

The process pressure for the high-pressure annealing process may lie in between about 10 atm to about 70 atm.

The structure may be heated under a temperature of about 200° C. to about 700° C. for about 3 minutes to about 60 minutes. The annealing process is performed after depositing the first gate dielectric layer 542. In some embodiments, when the first gate dielectric layer 542 is made of a high-k dielectric material that containing oxygen, both oxygen-containing and oxygen-free gas may be introduced into ambient of the annealing process. That is, the annealing process may be performed in oxygen-containing gas or oxygen-free gas. The oxygen for forming the interfacial layer 550 may be originated from the atmosphere used in the annealing process and/or the material of the first gate dielectric layer 542. The oxygen-containing gas may include at least one of $O_2$, $O_3$, $H_2O$, $D_2O$, NO, $N_2O$, and $NO_2$, and the oxygen-free gas may be an inert gas, such as nitrogen ($N_2$), argon (Ar), and a combination thereof. Other conditions of the annealing process may be referred to those exemplified for the counterparts of FIG. 1B.

The formed interfacial layer 550 after the high-pressure annealing may be a few angstrom thick (e.g., about 5 Å to about 50 Å), which may be tuned by annealing condition, properties of the atmosphere-modulation layer 530 and the first gate dielectric layer 542, and materials of the semiconductor substrate 510.

Referring to FIG. 5D, a second gate dielectric layer 544 and a gate electrode 560 are formed over the first gate dielectric layer 542 to form the semiconductor device 500. In some embodiments, the second gate dielectric layer 544 is formed by depositing onto the first gate dielectric layer 542. The deposition may be performed by, but not limited to, ALD. The gate electrode 560 may be subsequently deposited over the second gate dielectric layer 544. Other features such as materials and forming manners of the second gate dielectric layer 544 and the gate electrode 560 may be referred to those exemplified for the counterparts of FIG. 1C.

The difference between the forming methods shown in FIGS. 5A through 5D and FIGS. 3A through 3D is that the forming method shown in FIGS. 5A through 5D further includes a step of forming the second gate dielectric layer 544 before forming the gate electrode 560. This difference does not affect the functions and steps of other components in the embodiments. Therefore, the semiconductor device 500 and the forming method thereof have the same functions and advantages as the embodiments shown in FIGS. 3A through 3D.

FIGS. 6A through 6D are cross-sectional views at various stages of forming a semiconductor device 600 in accordance with some embodiments.

Figure 6A:
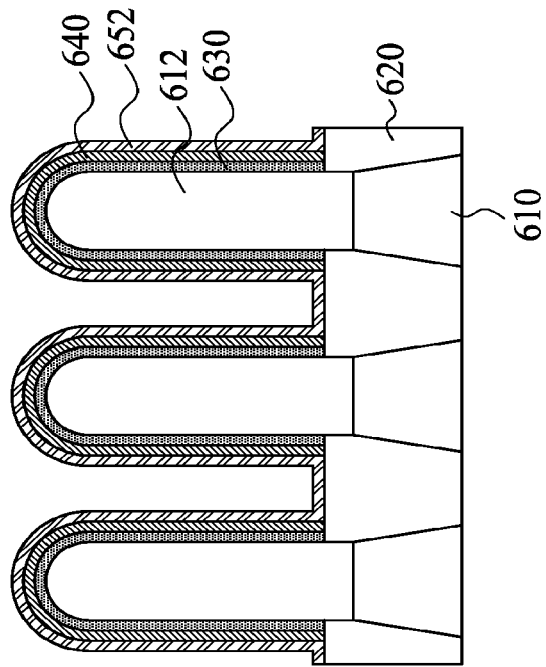
FIGS. 6A through 6D are cross-sectional views at various stages of forming a semiconductor device in accordance with some embodiments.

Referring to FIG. 6A, a semiconductor substrate 610 is received, and the semiconductor substrate 610 includes channels 612. Isolation structures 620 may be formed in the semiconductor substrate 610, and between two adjacent channels 612. An initial layer 630 is formed over the channels 612, and an atmosphere-modulation layer 640 is formed over the initial layer 630.

The semiconductor substrate 610 and the channels 612 may be made of the same or different materials, which may be independently selected from the group consisting of pure silicon, pure germanium, a Group IV compound, a Group III-V compound, and a combination thereof.

In some embodiments, the material of the initial layer 630 is native oxide, intentionally formed oxide by process (including deposition, chemical reaction, or thermal growth), silicon, or a combination thereof.

The atmosphere-modulation layer 640 has a thickness in a range from about 5 Å to about 20 Å. The atmosphere-modulation layer 640 may be made of a material selected from the group consisting of metal nitride (e.g., $AlN_x$), oxynitride (e.g., $SiO_xN_y$), and a combination thereof. The atmosphere-modulation layer 640 may be formed by any suitable nitridation or deposition processes (e.g., plasma nitridation or ALD).

Other features such as materials and forming manners of the semiconductor substrate 610, the channels 612, the isolation structures 620, and the atmosphere-modulation layer 640 may be referred to those exemplified for the counterparts of FIG. 1A. Further, other features of the initial layer 630 may be referred to those exemplified for the counterparts of FIG. 2A.

Figure 6B:
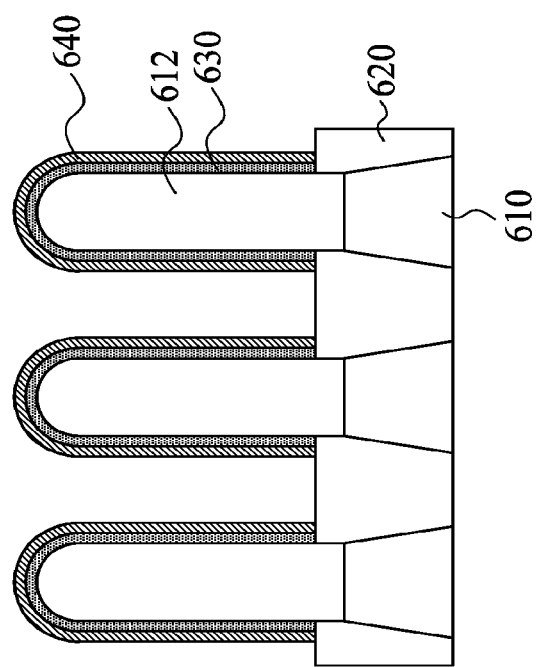

Referring to FIG. 6B, a first gate dielectric layer 652 is formed over the atmosphere-modulation layer 640. In some embodiments, the first gate dielectric layer 652 is formed by depositing onto the atmosphere-modulation layer 640. The deposition may be performed by, but not limited to, ALD. The material of the first gate dielectric layer 652 may be referred to those exemplified for the counterparts of FIG. 1C.

Figure 6D:
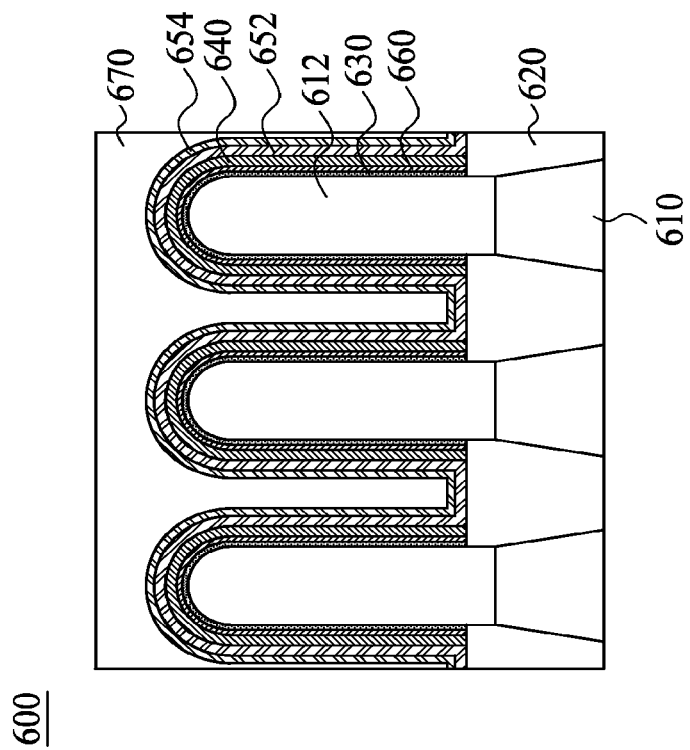
Figure 6C:
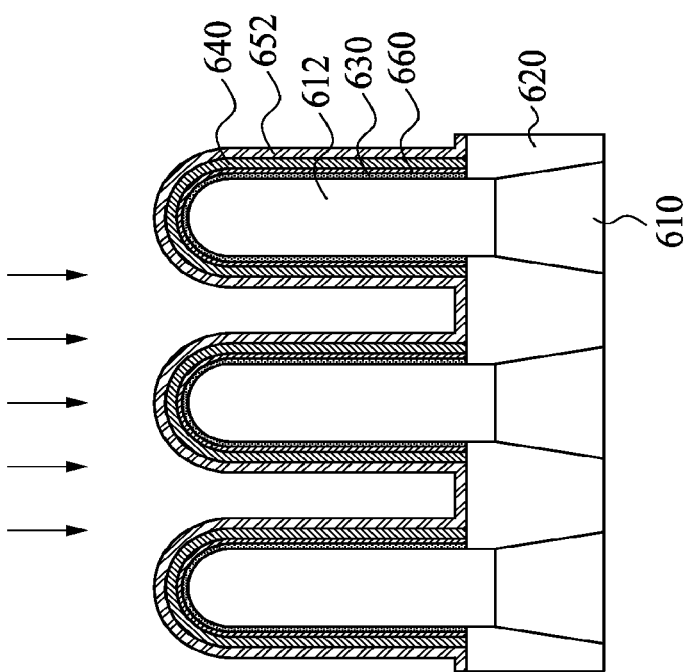

Referring to FIG. 6C, an annealing process is performed, thereby forming an interfacial layer 660 from the initial layer 630. The formed interfacial layer 660 is between the initial layer 630 and the atmosphere-modulation layer 640.

The process pressure for the high-pressure annealing process may lie in between about 10 atm to about 70 atm. The structure may be heated under a temperature of about 200° C. to about 700° C. for about 3 minutes to about 60 minutes. The annealing process is performed after depositing the first gate dielectric layer 652. In some embodiments, when the first gate dielectric layer 652 is made of a high-k dielectric material that containing oxygen, both oxygen-containing and oxygen-free gas may be introduced into ambient of the annealing process. That is, the annealing process may be performed in oxygen-containing gas or oxygen-free gas. The oxygen for forming the interfacial layer 660 may be originated from the atmosphere used in the annealing process and/or the material of the first gate dielectric layer 652. The oxygen-containing gas may include at least one of $O_2$, $O_3$, $H_2O$, $D_2O$, NO, $N_2O$, and $NO_2$, and the oxygen-free gas may be an inert gas, such as nitrogen ($N_2$), argon (Ar), and a combination thereof. Other conditions of the annealing process may be referred to those exemplified for the counterparts of FIG. 1B.

The formed interfacial layer 660 after the high-pressure annealing may be a few angstrom thick (e.g., about 5 Å to about 50 Å), which may be tuned by annealing condition, properties of the atmosphere-modulation layer 630 and the first gate dielectric layer 652, and materials of the semiconductor substrate 610.

Referring to FIG. 6D, a second gate dielectric layer 654 and a gate electrode 670 are formed over the first gate dielectric layer 652 to form the semiconductor device 600. In some embodiments, the second gate dielectric layer 654 is formed by depositing onto the first gate dielectric layer 652. The deposition may be performed by, but not limited to, ALD. The gate electrode 670 may be subsequently deposited over the second gate dielectric layer 654. Other features such as materials and forming manners of the second gate dielectric layer 654 and the gate electrode 670 may be referred to those exemplified for the counterparts of FIG. 1C.

The difference between the forming methods shown in FIGS. 6A through 6D and FIGS. 4A through 4D is that the forming method shown in FIGS. 6A through 6D further includes a step of forming the second gate dielectric layer 654 before forming the gate electrode 670. This difference does not affect the functions and steps of other components in the embodiments. Therefore, the semiconductor device 600 and the forming method thereof have the same functions and advantages as the embodiments shown in FIGS. 4A through 4D.

FIGS. 7A through 7D are cross-sectional views at various stages of forming a semiconductor device 700 in accordance with some embodiments.

Figure 7B:
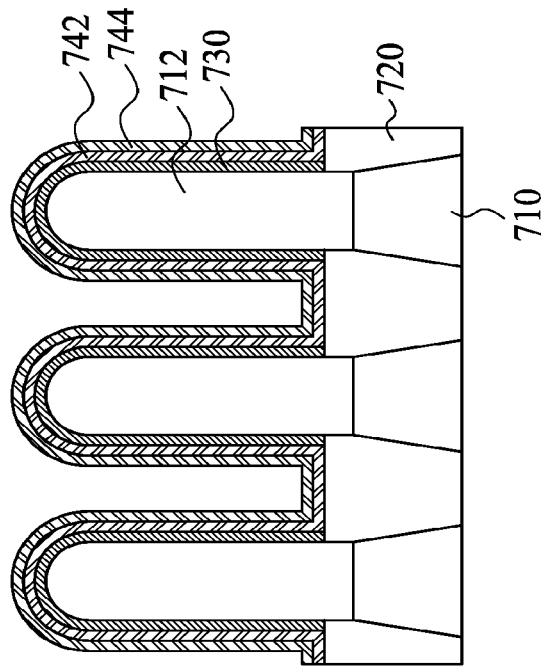
FIGS. 7A through 7D are cross-sectional views at various stages of forming a semiconductor device in accordance with some embodiments.
Figure 7A:
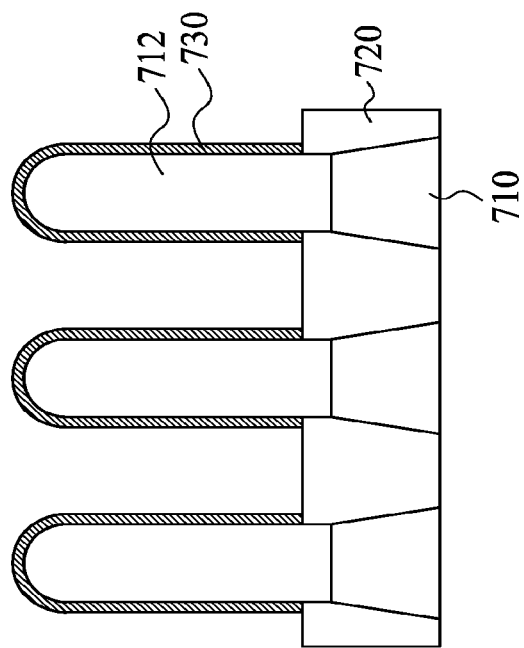

Referring to FIG. 7A, a semiconductor substrate 710 is received, and the semiconductor substrate 710 includes channels 712. Isolation structures 720 may be formed in the semiconductor substrate 710, and between two adjacent channels 712. An atmosphere-modulation layer 730 is formed over the channels 712.

The semiconductor substrate 710 and the channels 712 may be made of the same or different materials, which may be independently selected from the group consisting of pure silicon, pure germanium, a Group IV compound, a Group III-V compound, and a combination thereof.

The atmosphere-modulation layer 730 has a thickness in a range from about 5 Å to about 20 Å. The atmosphere-modulation layer 730 may be made of a material selected from the group consisting of metal nitride (e.g., $AlN_x$), oxynitride (e.g., $SiO_xN_y$), and a combination thereof. The atmosphere-modulation layer 730 may be formed by any suitable nitridation or deposition processes (e.g., plasma nitridation or ALD).

Other features such as materials and forming manners of the semiconductor substrate 710, the channels 712, the isolation structures 720, and the atmosphere-modulation layer 730 may be referred to those exemplified for the counterparts of FIG. 1A.

Referring to FIG. 7B, a first gate dielectric layer 742 and a second gate dielectric layer 744 are formed over the atmosphere-modulation layer 730. In some embodiments, the first gate dielectric layer 742 is formed by depositing onto the atmosphere-modulation layer 730, and the second gate dielectric layer 744 is formed by depositing onto the first gate dielectric layer 742. The deposition may be performed by, but not limited to, ALD. The materials of the first gate dielectric layer 742 and the second gate dielectric layer 744 may be referred to those exemplified for the counterparts of FIG. 1C.

Figure 7D:
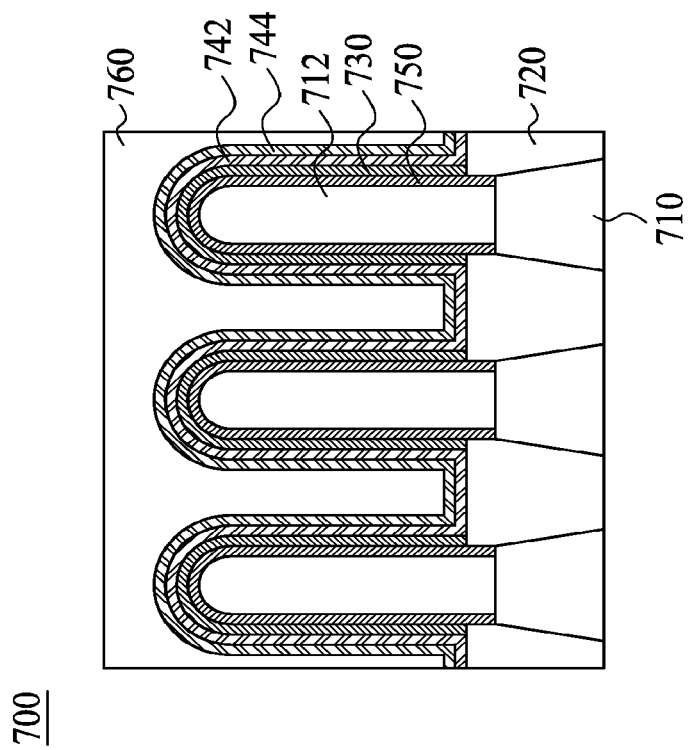
Figure 7C:
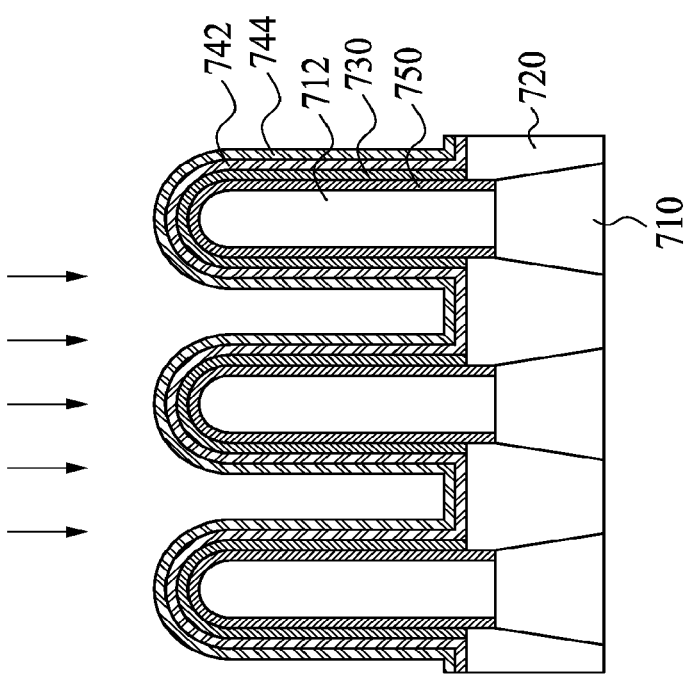

Referring to FIG. 7C, an annealing process is performed, thereby forming an interfacial layer 750 from the channels 712. The formed interfacial layer 750 is between the channels 712 and the atmosphere-modulation layer 730.

The process pressure for the high-pressure annealing process may lie in between about 10 atm to about 70 atm. The structure may be heated under a temperature of about 200° C. to about 700° C. for about 3 minutes to about 60 minutes. The annealing process is performed after depositing the first gate dielectric layer 742 and the second gate dielectric layer 744. In some embodiments, when the first gate dielectric layer 742 and/or the second gate dielectric layer 744 is made of a high-k dielectric material that containing oxygen, both oxygen-containing and oxygen-free gas may be introduced into ambient of the annealing process. That is, the annealing process may be performed in oxygen-containing gas or oxygen-free gas. The oxygen for forming the interfacial layer 750 may be originated from the atmosphere used in the annealing process and/or at least one of the materials of the first gate dielectric layer 742 and the second gate dielectric layer 744. The oxygen-containing gas may include at least one of $O_2$, $O_3$, $H_2O$, $D_2O$, NO, $N_2O$, and $NO_2$, and the oxygen-free gas may be an inert gas, such as nitrogen ($N_2$), argon (Ar), and a combination thereof. Other conditions of the annealing process may be referred to those exemplified for the counterparts of FIG. 1B.

The formed interfacial layer 750 after the high-pressure annealing may be a few angstrom thick (e.g., about 5 Å to about 50 Å), which may be tuned by annealing condition, properties of the atmosphere-modulation layer 730, the first gate dielectric layer 742, and the second gate dielectric layer 744, and materials of the semiconductor substrate 710.

Referring to FIG. 7D, a gate electrode 760 is formed over the second gate dielectric layer 744 to form the semiconductor device 700. The gate electrode 760 may be formed by deposition. Other features such as materials and forming manners of the gate electrode 760 may be referred to those exemplified for the counterparts of FIG. 1C.

The embodiments shown in FIG. 7A through 7D describe a bi-layered gate dielectric structure (i.e., the first gate dielectric layer 742 and the second gate dielectric layer 744). In some other embodiments, the method can be extended to a multi-layered gate dielectric structure. The gate electrode may be subsequently formed over the outmost gate dielectric layer.

The difference between the forming methods shown in FIGS. 7A through 7D and FIGS. 3A through 3D is that the forming method shown in FIGS. 7A through 7D applies bi-layered gate dielectric structure, which further includes a step of forming the second gate dielectric layer 744 before performing the annealing process. This difference does not affect the functions and steps of other components in the embodiments. Therefore, the semiconductor device 700 and the forming method thereof have the same functions and advantages as the embodiments shown in FIGS. 3A through 3D.

FIGS. 8A through 8D are cross-sectional views at various stages of forming a semiconductor device 800 in accordance with some embodiments.

Figure 8A:
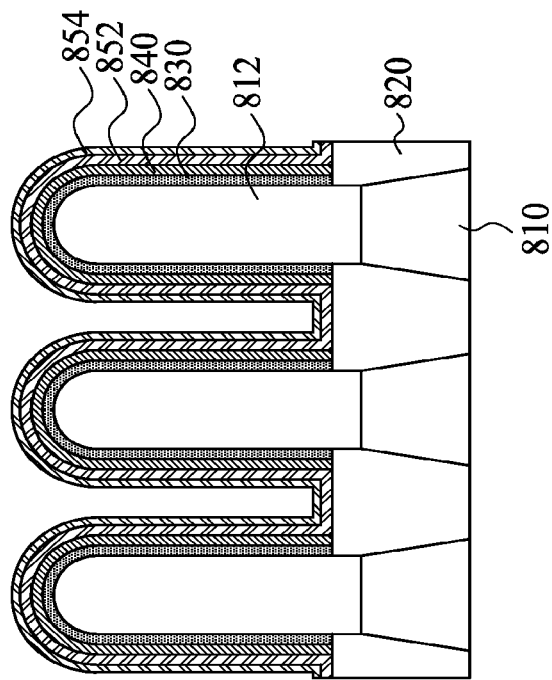
FIGS. 8A through 8D are cross-sectional views at various stages of forming a semiconductor device in accordance with some embodiments.
Figure 8B:
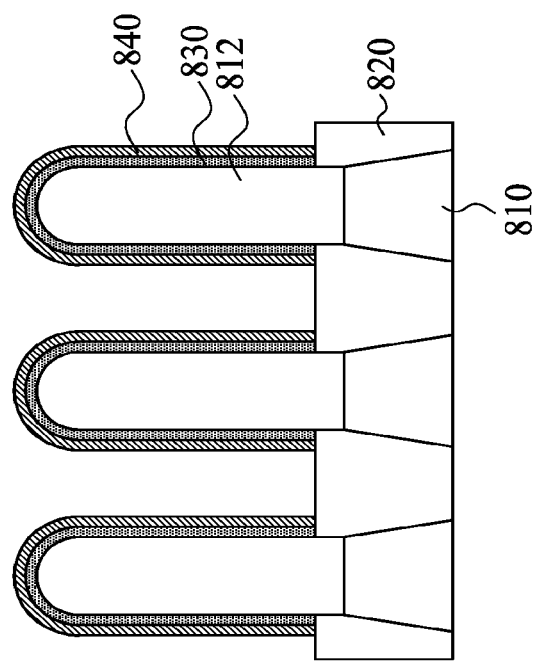

Referring to FIG. 8A, a semiconductor substrate 810 is received, and the semiconductor substrate 810 includes channels 812. Isolation structures 820 may be formed in the semiconductor substrate 810, and between two adjacent channels 812. An initial layer 830 is formed over the channels 812, and an atmosphere-modulation layer 840 is formed over the initial layer 830.

The semiconductor substrate 810 and the channels 812 may be made of the same or different materials, which may be independently selected from the group consisting of pure silicon, pure germanium, a Group IV compound, a Group III-V compound, and a combination thereof.

In some embodiments, the material of the initial layer 830 is native oxide, intentionally formed oxide by process (including deposition, chemical reaction, or thermal growth), silicon, or a combination thereof.

The atmosphere-modulation layer 840 has a thickness in a range from about 5 Å to about 20 Å. The atmosphere-modulation layer 840 may be made of a material selected from the group consisting of metal nitride (e.g., $AlN_x$), oxynitride (e.g., $SiO_xN_y$), and a combination thereof. The atmosphere-modulation layer 840 may be formed by any suitable nitridation or deposition processes (e.g., plasma nitridation or ALD).

Other features such as materials and forming manners of the semiconductor substrate 810, the channels 812, the isolation structures 820, and the atmosphere-modulation layer 840 may be referred to those exemplified for the counterparts of FIG. 1A. Further, other features of the initial layer 830 may be referred to those exemplified for the counterparts of FIG. 2A.

Referring to FIG. 6B, a first gate dielectric layer 852 and a second gate dielectric layer 854 are formed over the atmosphere-modulation layer 840. In some embodiments, the first gate dielectric layer 852 is formed by depositing onto the atmosphere-modulation layer 840, and the second gate dielectric layer 854 is formed by depositing onto the first gate dielectric layer 852. The deposition may be performed by, but not limited to, ALD. The materials of the first gate dielectric layer 852 and the second gate dielectric layer 854 may be referred to those exemplified for the counterparts of FIG. 1C.

Figure 8D:
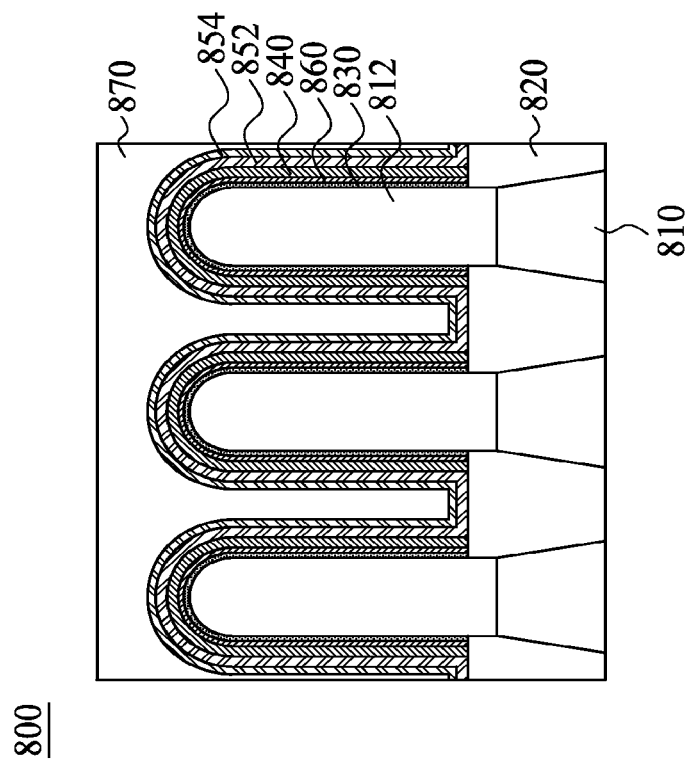
Figure 8C:
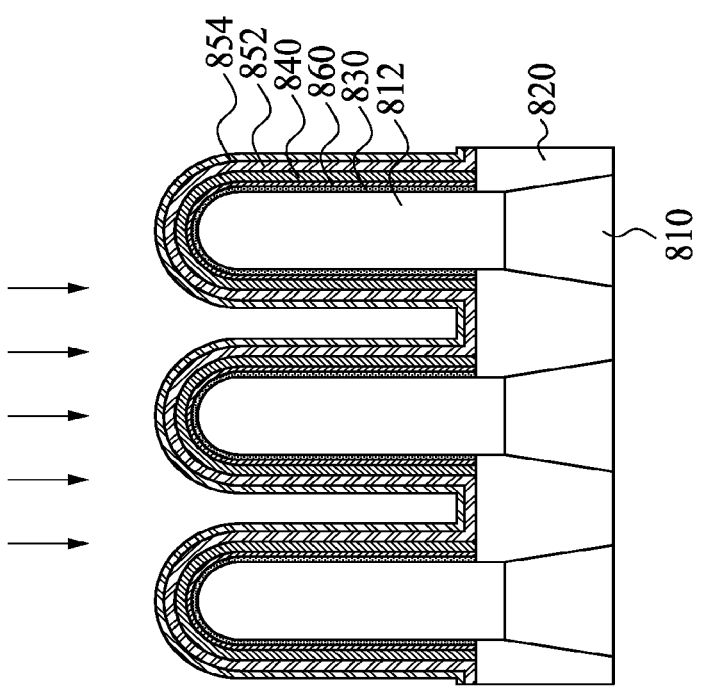

Referring to FIG. 8C, an annealing process is performed, thereby forming an interfacial layer 860 from the initial layer 830. The formed interfacial layer 860 is between the initial layer 830 and the atmosphere-modulation layer 840.

The process pressure for the high-pressure annealing process may lie in between about 10 atm to about 70 atm. The structure may be heated under a temperature of about 200° C. to about 700° C. for about 3 minutes to about 60 minutes. The annealing process is performed after depositing the first gate dielectric layer 852 and the second gate dielectric layer 854. In some embodiments, when the first gate dielectric layer 852 and/or the second gate dielectric layer 854 is made of a high-k dielectric material that containing oxygen, both oxygen-containing and oxygen-free gas may be introduced into ambient of the annealing process. That is, the annealing process may be performed in oxygen-containing gas or oxygen-free gas. The oxygen for forming the interfacial layer 860 may be originated from the atmosphere used in the annealing process and/or at least one of the materials of the first gate dielectric layer 852 and the second gate dielectric layer 854. The oxygen-containing gas may include at least one of $O_2$, $O_3$, $H_2O$, $D_2O$, NO, $N_2O$, and $NO_2$, and the oxygen-free gas may be an inert gas, such as nitrogen ($N_2$), argon (Ar), and a combination thereof. Other conditions of the annealing process may be referred to those exemplified for the counterparts of FIG. 1B.

The formed interfacial layer 860 after the high-pressure annealing may be a few angstrom thick (e.g., about 5 Å to about 50 Å), which may be tuned by annealing condition, properties of the atmosphere-modulation layer 840, the first gate dielectric layer 852, and the second gate dielectric layer 854, and materials of the semiconductor substrate 810.

Referring to FIG. 8D, a gate electrode 870 is formed over the second gate dielectric layer 854 to form the semiconductor device 800. The gate electrode 870 may be formed by deposition. Other features such as materials and forming manners of the gate electrode 870 may be referred to those exemplified for the counterparts of FIG. 1C.

The embodiments shown in FIG. 8A through 8D describe a bi-layered gate dielectric structure (i.e., the first gate dielectric layer 852 and the second gate dielectric layer 854). In some other embodiments, the method can be extended to a multi-layered gate dielectric structure. The gate electrode may be subsequently formed over the outmost gate dielectric layer.

The difference between the forming methods shown in FIGS. 8A through 8D and FIGS. 4A through 4D is that the forming method shown in FIGS. 8A through 8D applies bi-layered gate dielectric structure, which further includes a step of forming the second gate dielectric layer 854 before performing the annealing process. This difference does not affect the functions of other components and steps in the embodiments. Therefore, the semiconductor device 800 and the forming method thereof have the same functions and advantages as the embodiments shown in FIGS. 4A through 4D.

The embodiments of the present disclosure discussed above have advantages over existing methods and systems. The method for forming the semiconductor device is a highly integrated, low-thermal budget gate stack process, which applies the atmosphere-modulation layer, thereby improving the uniformity of the interfacial layer and strain relaxation. Further, the method offers one-step passivation strategy for gate dielectric layer/interfacial layer and interfacial layer/semiconductor substrate interfaces. That is, the method combines the passivations of both gate dielectric layer/interfacial layer and interfacial layer/semiconductor substrate into one-step process, which is cost saving. The method retains low-thermal budget during process and less strain relaxation, and is suitable for high-mobility channel such as Ge-containing and Group III-V based materials. It is understood, however, that other embodiments may have different advantages, and that no particular advantages is required for all embodiments.

In accordance with some embodiments of the present disclosure, a method for forming a semiconductor device includes receiving a semiconductor substrate including a channel. An atmosphere-modulation layer is formed over the channel. An annealing process is performed to form an interfacial layer between the channel and the atmosphere-modulation layer.

In accordance with other embodiments of the present disclosure, a semiconductor device includes a semiconductor substrate including a channel, an interfacial layer, and an atmosphere-modulation layer. The interfacial layer is over the channel. The atmosphere-modulation layer is over the interfacial layer.

In accordance with yet other embodiments of the present disclosure, a semiconductor device includes a semiconductor substrate, a fin structure, an interfacial layer, and a nitrogen-containing layer. The fin structure is over the semiconductor substrate. The interfacial layer is over the fin structure. The nitrogen-containing layer is over the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate comprising a channel structure;
   an isolation structure over the semiconductor substrate;
   an interfacial layer over the channel structure;
   an atmosphere-modulation layer over the interfacial layer, wherein:
      the atmosphere-modulation layer is in contact with the isolation structure, and
      the atmosphere-modulation layer overlies the channel structure; and
   a gate dielectric layer over the atmosphere-modulation layer and in contact with the isolation structure.

2. The semiconductor device of claim 1, wherein the interfacial layer is in contact with the isolation structure.

3. The semiconductor device of claim 1, wherein the interfacial layer is in contact with the atmosphere-modulation layer.

4. The semiconductor device of claim 1, wherein the gate dielectric layer is in contact with the atmosphere-modulation layer.

5. The semiconductor device of claim 1, comprising:
an initial layer between the channel structure and the interfacial layer.

6. The semiconductor device of claim 5, wherein the initial layer is in contact with the isolation structure.

7. The semiconductor device of claim 1, comprising:
a second gate dielectric layer over the gate dielectric layer and in contact with the gate dielectric layer.

8. The semiconductor device of claim 1, wherein the atmosphere-modulation layer comprises at least one of a metal nitride or an oxynitride.

9. The semiconductor device of claim 1, wherein the atmosphere-modulation layer comprises nitrogen.

10. A semiconductor device, comprising:
a semiconductor substrate;
a channel structure protruding from the semiconductor substrate;
an interfacial layer over the channel structure;
an atmosphere-modulation layer over the interfacial layer, wherein the atmosphere-modulation layer has a shorter length than the interfacial layer; and
a gate dielectric layer over the atmosphere-modulation layer, wherein the atmosphere-modulation layer extends continuously from a first sidewall of the interfacial layer to a second sidewall of the interfacial layer to cover the interfacial layer and separate the interfacial layer from the gate dielectric layer.

11. The semiconductor device of claim 10, comprising:
an initial layer between the channel structure and the interfacial layer.

12. The semiconductor device of claim 11, wherein the initial layer separates the semiconductor substrate from the interfacial layer.

13. The semiconductor device of claim 10, comprising:
a second gate dielectric layer over the gate dielectric layer; and
a gate electrode over the second gate dielectric layer.

14. The semiconductor device of claim 13, wherein the second gate dielectric layer is in contact with the gate dielectric layer.

15. A method for forming a semiconductor device, the method comprising:
receiving a semiconductor substrate comprising a channel structure protruding from the semiconductor substrate;
forming an isolation structure over the semiconductor substrate;
forming an atmosphere-modulation layer over the channel structure and in contact with the isolation structure;
performing an annealing process to form an interfacial layer between the channel structure and the atmosphere-modulation layer, wherein the atmosphere-modulation layer remains in contact with the isolation structure after the annealing process; and
forming a gate dielectric layer over the atmosphere-modulation layer and in contact with the isolation structure.

16. The method of claim 15, comprising:
forming an initial layer over the channel structure prior to forming the atmosphere-modulation layer, wherein the interfacial layer is formed between the initial layer and the atmosphere-modulation layer.

17. The method of claim 15, wherein the interfacial layer is in contact with the isolation structure.

18. The method of claim 15, wherein forming the gate dielectric layer comprises forming the gate dielectric layer before performing the annealing process.

19. The method of claim 15, comprising forming a second gate dielectric layer over the gate dielectric layer after performing the annealing process.

20. The method of claim 15, wherein:
forming the gate dielectric layer comprises forming the gate dielectric layer before performing the annealing process, and
the method comprises forming a second gate dielectric layer over the gate dielectric layer before performing the annealing process.

* * * * *